(12) United States Patent
Raychaudhuri et al.

(10) Patent No.: US 10,519,037 B2
(45) Date of Patent: Dec. 31, 2019

(54) MULTIPASS TRANSFER SURFACE FOR DYNAMIC ASSEMBLY

(71) Applicant: PALO ALTO RESEARCH CENTER INCORPORATED, Palo Alto, CA (US)

(72) Inventors: Sourobh Raychaudhuri, Mountain View, CA (US); Jeng Ping Lu, Fremont, CA (US); David K. Biegelsen, Portola Valley, CA (US)

(73) Assignee: PALO ALTO RESEARCH CENTER INCORPORATED, Palo Alto, CA (US)

(*) Notice: Subject to any disclaimer, the term of this patent is extended or adjusted under 35 U.S.C. 154(b) by 603 days.

(21) Appl. No.: 14/997,680

(22) Filed: Jan. 18, 2016

(65) Prior Publication Data
US 2017/0205734 A1 Jul. 20, 2017

(51) Int. Cl.
*B81C 99/00* (2010.01)
*H01L 21/683* (2006.01)
*H02N 13/00* (2006.01)

(52) U.S. Cl.
CPC ........ *B81C 99/002* (2013.01); *H01L 21/6833* (2013.01); *H02N 13/00* (2013.01)

(58) Field of Classification Search
CPC ....... H01L 21/00; H01L 21/6831–6833; H01L 21/677–67796; H02N 13/00; B81C 99/002–0025; B91C 99/002
See application file for complete search history.

(56) References Cited

U.S. PATENT DOCUMENTS

| 6,942,776 B2* | 9/2005 | Medoro | B03C 5/026 204/547 |
| 2014/0158415 A1* | 6/2014 | Golda | B81C 99/002 174/262 |
| 2015/0262856 A1* | 9/2015 | Thompson | B81C 99/002 361/145 |

FOREIGN PATENT DOCUMENTS

WO WO-2013169545 A1 * 11/2013 ......... H01L 25/0753

* cited by examiner

*Primary Examiner* — Thienvu V Tran
*Assistant Examiner* — Christopher J Clark
(74) *Attorney, Agent, or Firm* — Miller Nash Graham and Dunn (57) ABSTRACT

An intermediate transfer surface includes a substrate, a two-dimensional array of electrodes, a dielectric spacer layer on the two-dimensional array of electrodes, and a voltage controller electrically connected to the array of electrodes. A method of manufacturing an intermediate transfer surface, depositing an array of etch stops on a conductive surface, etching the conductive surface to form mesas of the conductive surface separated by gaps, and coating the mesas with a dielectric coating. A microassembly system includes an assembly surface having a first two dimensional array of potential wells on a first surface, a first voltage source electrically connected to the first array of potential wells, an intermediate transfer surface having a second two dimensional array of potential wells on a second surface arranged to face the first surface, and a second voltage source electrically connected to the second array of potential wells.

15 Claims, 9 Drawing Sheets

MULTIPASS TRANSFER SURFACE FOR DYNAMIC ASSEMBLY

TECHNICAL FIELD

These disclosures relate to microassemblers, more particularly to microassemblers that use assembly templates.

BACKGROUND

Microassembler systems use a dynamic, electrostatic template, such as a two-dimensional array of controllable voltage electrodes to create electric field patterns. The field patterns manipulate and align particles or chiplets, typically suspended in a solution, into an assembly. The pitch of the electrodes defines the design grid of the assembly and determines at what resolution a designer may be able to place and align particles in an assembly. The design grids may have a scale of 100s of microns down to a micron.

Assemblers can assemble a single particle type, or could be used to assemble different particle types. Assembling multiple particle types can be done simultaneously using feedback control to appropriately place different types of particles or in a sequence of assembly steps. In all these cases, a challenge exists when transferring an assembly from the assembly template to a final substrate, if a dielectric layer covering the assembly template does not become the final substrate. Maintaining fidelity of the assembly presents a first level of challenge, which increases when the process involves multiple assemblies that require proper alignment with high fidelity.

SUMMARY

A first embodiment is an intermediate transfer surface includes a substrate, a two-dimensional array of electrodes, a dielectric spacer layer on the two-dimensional array of electrodes, and a voltage controller electrically connected to the array of electrodes. A second embodiment is a method of manufacturing an intermediate transfer surface, depositing an array of etch stops on a conductive surface, etching the conductive surface to form mesas of the conductive surface separated by gaps, and coating the mesas with a dielectric coating. A third embodiment is a microassembly system that includes an assembly surface having a first two dimensional array of potential wells on a first surface, a first voltage source electrically connected to the first array of potential wells, an intermediate transfer surface having a second two dimensional array of potential wells on a second surface arranged to face the first surface, and a second voltage source electrically connected to the second array of potential wells.

DETAILED DESCRIPTION OF THE EMBODIMENTS

A microassembler system uses a dynamic electrostatic template, which typically consists of two-dimensional array of voltage electrodes controlled by software. The software controls the electrodes to create electric field patterns. The field patterns manipulate and align particles or chiplets, suspended in a solution, into an assembly. For purposes of this discussion, the particles or chiplets suspended in solution will be referred to as elements or assembly elements. The pitch of the electrodes defines the design grid of assembly and determines with what resolution a designer might be able to place and align particles in an assembly. The challenge lies in transferring an assembly from the assembly template to the substrate.

Figure 1:
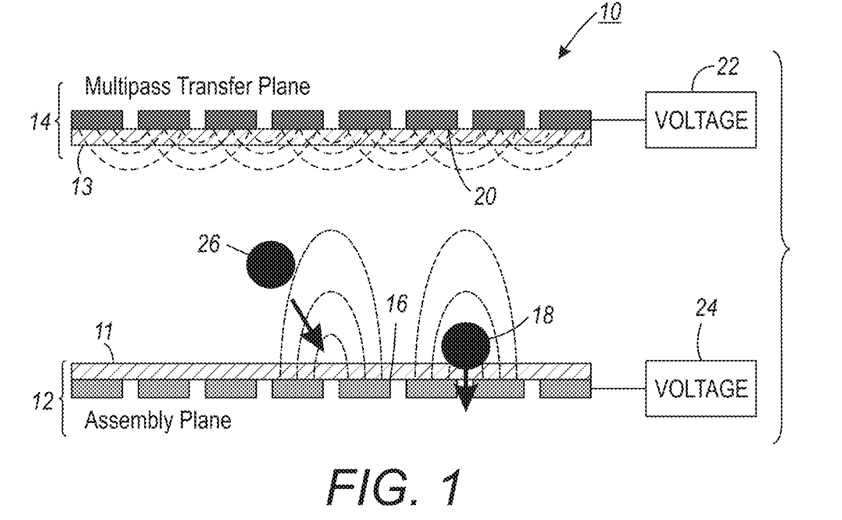
FIGS. 1-3 show cross sectional views of an assembly template and an intermediate transfer surface.

FIG. 1 shows a cross-sectional view of a microassembly system 10 employing an intermediate transfer surface. The system includes an assembly plane 12, controlled by some sort of voltage controller 24. Elements such as 18 and 26 are attracted to the electrostatic potential wells between the electrodes such as 16. Once all of the elements are placed on the assembly plane they form an assembly. The assembly would typically be transferred to the final substrate. Registration when transferring to the final substrate can be difficult to maintain. A thin dielectric separator 11 will typically be on the assembly plane 12 and another 13 on the multipass transfer plane 14. For simplicity in the drawings, these layers are only shown in FIG. 1, but must be understood to exist in all embodiments of both surfaces.

The embodiments here make it possible to maintain the registration of the elements to one and other by using an intermediate transfer surface. The intermediate transfer surface 14 shown in the embodiment of FIG. 1 also has a two dimensional array of potential wells, in this embodiment formed by an array of electrodes such as 20. One should note that because of the cross-sectional view, the electrodes appear to be only one line, but are actually repeated going away from the front of the drawing. In FIG. 1, a computer or other voltage controller actuates the assembly template to assemble the elements into their desired locations and orientations. In addition, the elements could extend over multiple electrodes and have charge patterns commensurate with the grid.

Figure 2:
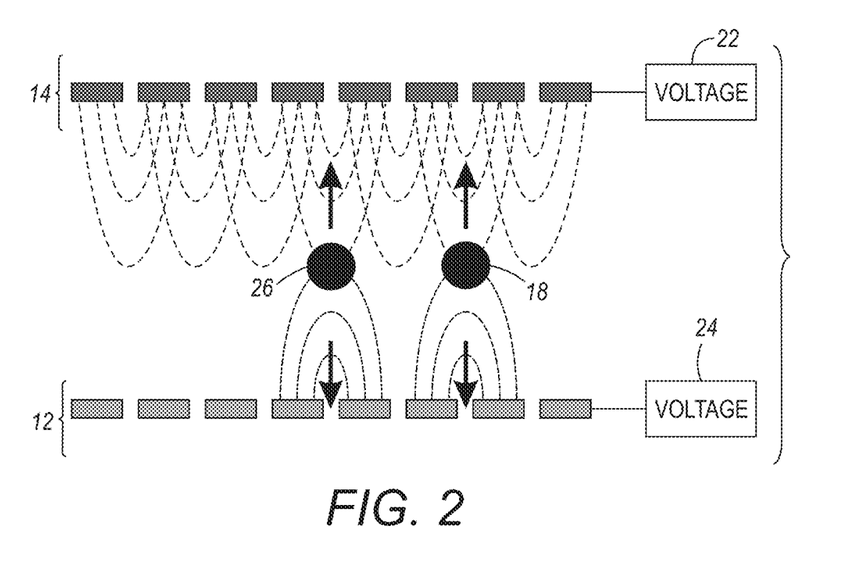

In FIG. 2, the assembly transfers to the intermediate transfer surface. In some embodiment, the transfer surface may be referred to as a multipass transfer surface, as it may be employed multiple times. In FIG. 2, the intermediate transfer surface 14 moves towards the assembly surface 12, which assists in maintaining fidelity of the original assembly. Similar to xerography, the template voltage control 24 can be selectively reversed to repulsively assist in the transfer of the particles to the transfer assembly. Because mechanical transfer can disturb the assembly, maintaining a small gap and then electrostatically levitating the elements from the assembly template to the intermediate will help maintain the fidelity. The controller 22 can increase the amplitude of the electric field on the intermediate transfer surface while the controller 24 decreases, or reverses the polarity of, the signal on the assembly surface. The gap between the two surfaces during the transfer should be on the order of the lateral electrode spacing in order to maintain fidelity. The electrostatic field patterns of the two assemblies can be commensurate and aligned or incommensurate and uncorrelated. For example, the electrodes on the transfer assembly could be on a finer pitch and simply grab transferred particles dielectrophoretically. Dielectrophoresis (DEP) exerts a force on a dielectric particle when it is subjected to a non-uniform electric field. This force does not require the particle to be charged. All particles exhibit dielectrophoretic activity in the presence of electric fields.

Figure 3:
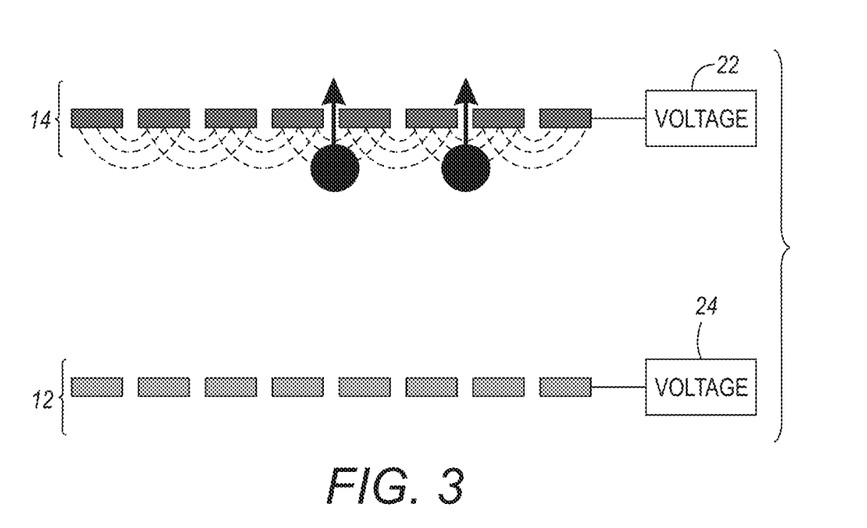

FIG. 3 shows the completion of the transfer. The elements are now electrostatically held on the transfer surface 14 with the same alignment as on the assembly template.

Figure 4:
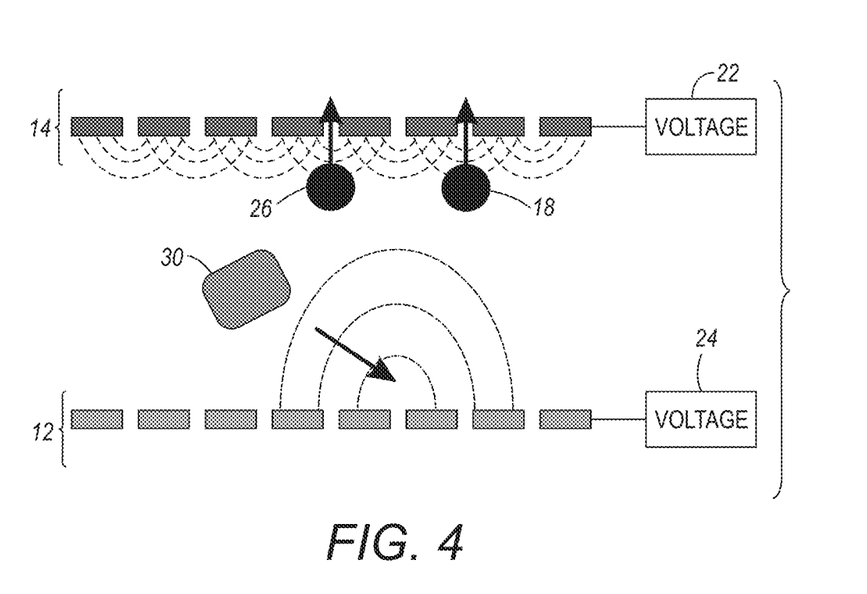
FIGS. 4-6 show cross sectional view of an assembly template and an intermediate transfer surface for multi-element transfers.
Figure 5:
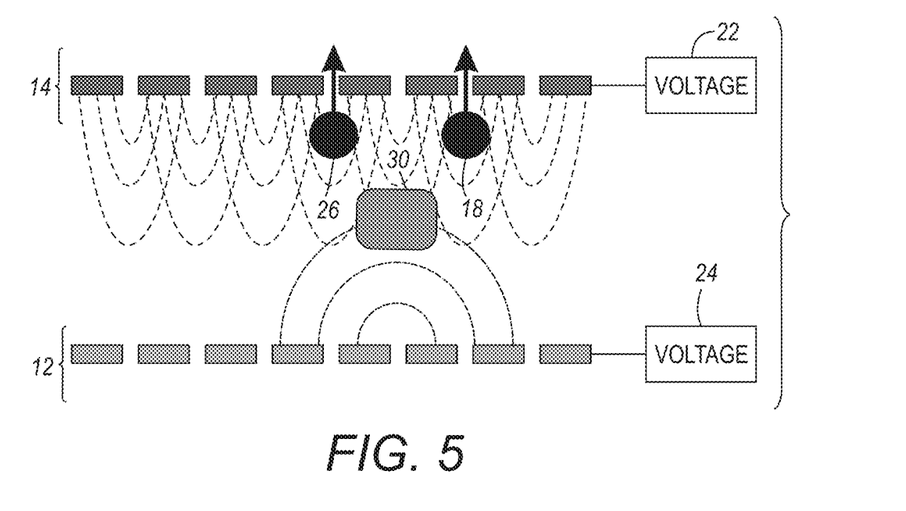
Figure 6:
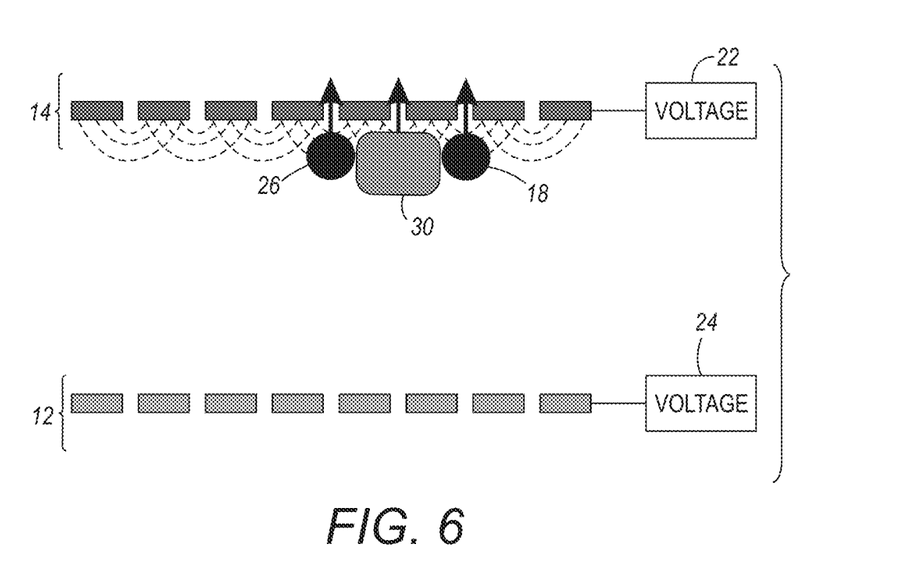

As mentioned above, the transfer surface may be referred to as a multipass transfer surface. FIGS. 4-6 show an example of this type of transfer. In FIG. 4, the elements 18 and 26 have been assembled into their desired positions on the assembly template and transferred to the transfer surface. Block 30 is assembled to a position between former positions of elements 18 and 26. If the elements 18 and 26 were left on the assembly surface, it would be extremely difficult or impossible to guide the block 30 around the elements and then place it in close proximity to them.

In the first pass, shown in FIG. 5, the elements 18 and 26 pass to the transfer surface. The block 30 then passes to the transfer surface. The resulting assembly on the transfer surface 14 is shown on FIG. 6. One should note that the elements shown in FIG. 6 are symmetric elements. The assembler has the ability to place and align asymmetric objects such as micro-wires. The potential wells on the transfer surface will maintain the position and orientation of these objects as well. In addition, the dielectric separator shown in FIG. 1 can be removable from the transfer plane to become the final substrate for the elements.

Figure 7:
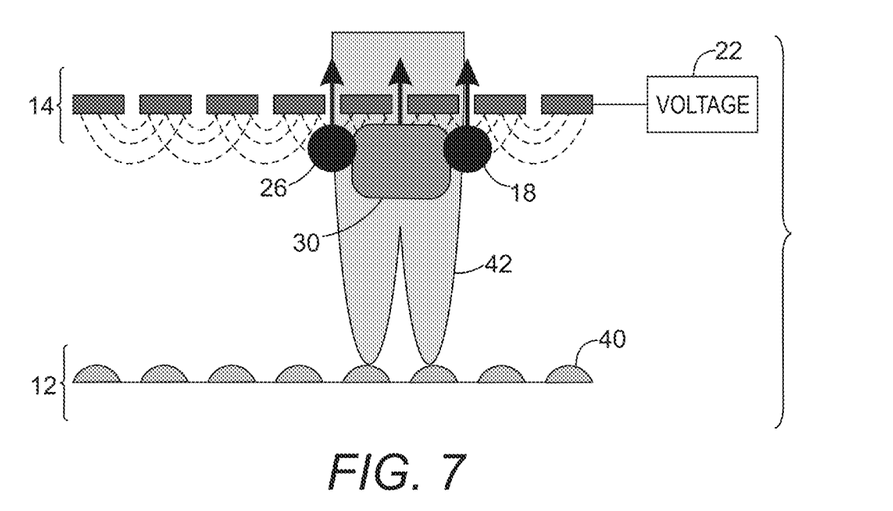
FIG. 7 shows an embodiment of a local optical cure on an intermediate transfer surface.

One variation of this process allows the assembly to be fused together with a cure on the transfer surface. This forms a single, monolithic assembly made up of the particles assembled on the assembly surface and then transferred to the transfer surface. FIG. 7 shows an example of this. The transfer surface 14 holds the assembly of elements 18, 20 and 26 with an applied voltage from the voltage source and/or controller 22. In this embodiment, a light source 40, such as an array of light emitting diodes (LEDs) that emit UV light 42 cure the assembly locally.

Another approach could be to use patterned light from a DLP that is focused on the assembly through appropriate optics to direct optical energy only at the interfaces one would like to fuse. A local cure means that the cure energy is directed only at the interfaces that we wish to cure, rather than the entire assembly. This may be advantageous as some materials in the assembly may be sensitive to excessive energy. The local cure serves to create a single assembly of assembled particles. The local cure may only be a temporary or partial cure which still allows the cured assembly to be moved to the final substrate.

Figure 8:
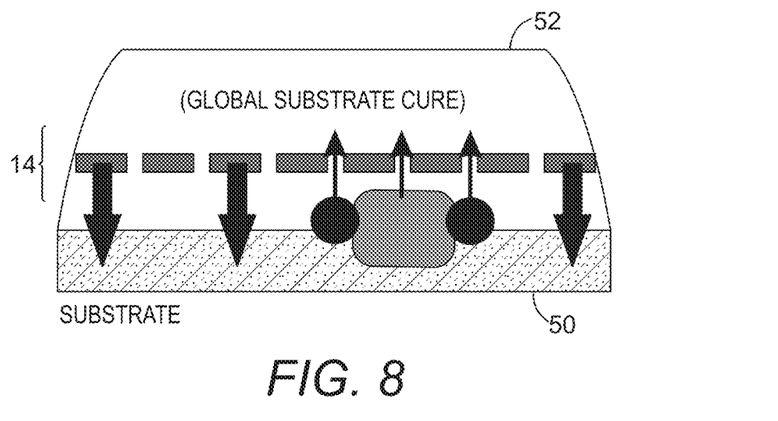
FIG. 8 shows an embodiment of a transfer from an intermediate transfer surface to a final substrate.

FIG. 8 shows an embodiment of an application of a global cure. The locally cured assembly transfers from the transfer surface 14 to the final substrate 50 and is then globally cured into place by global cure 52. One should note that global cure 52 and the local cure 42 may be one of many different types. The UV cure activation is just an example, the cure may be other types of radiant, thermal, chemical, etc.

Regardless of how the transfer is accomplished, the control of the electrostatic fields remains an important aspect of the embodiments. Generation of the potential wells may occur in many ways. In addition, the transfer surface may constitute a planar substrate or it may mount on a roll to achieve transfer a line at a time. Manufacture of the transfer surface may occur in many different ways. FIGS. 9-12 show one embodiment of a method of manufacturing a transfer surface.

Figure 9:
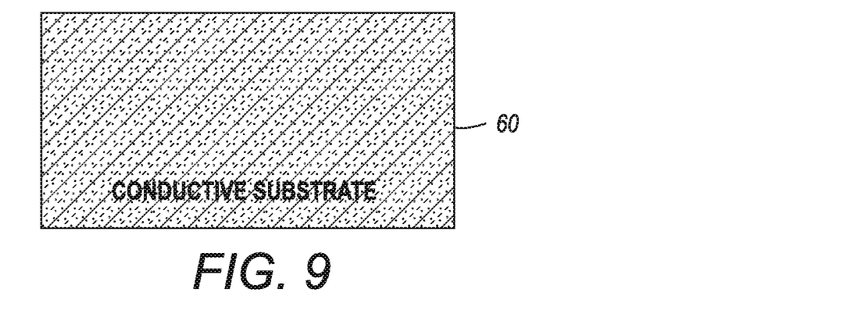
FIGS. 9-12 show an embodiment of a process of manufacturing an intermediate transfer surface.
Figure 10:
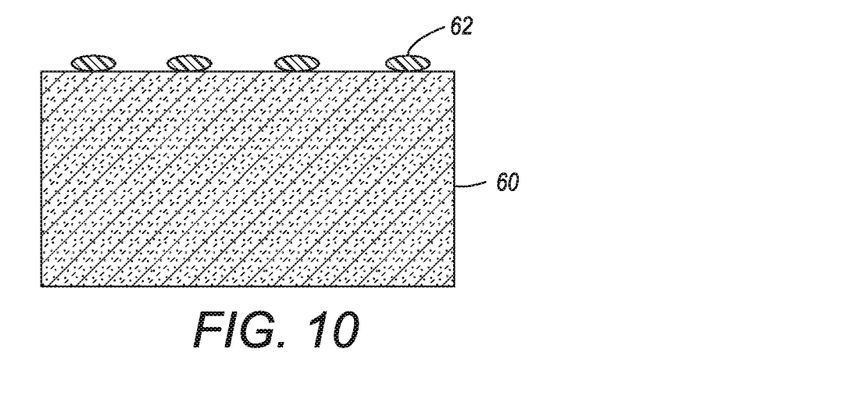
Figure 11:
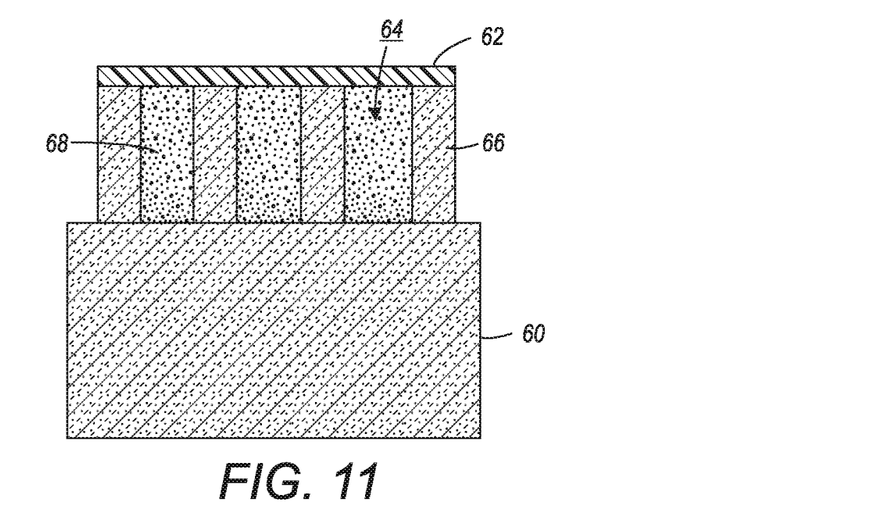
Figure 12:
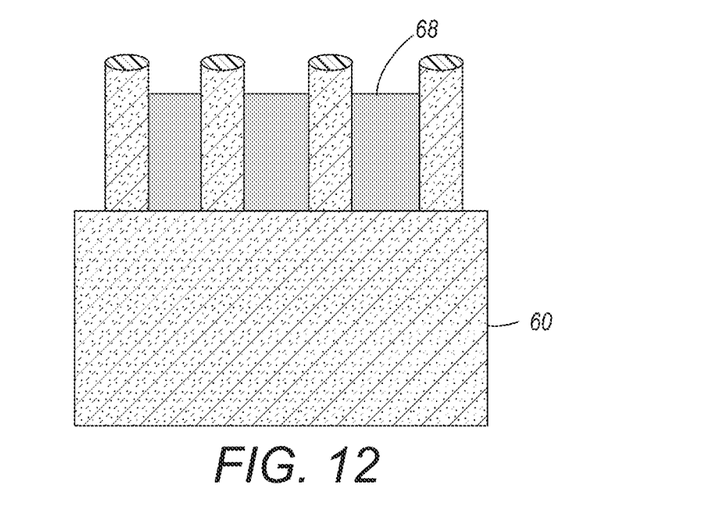

FIG. 9 shows a conductive surface 60 that can undergo texturing to form potential wells. The conductive surface 60 has formed upon it disks such as 62 that act as etch stops in FIG. 10. The surface then undergoes etching to produce mesas of the conductive surface such as 66 shown in FIG. 11. Gaps such as 64 separate the mesas filled with dielectric 68. The disks such as 62 are removed. In FIG. 12, the gaps 64 in FIG. 11 have been filled with the dielectric 68. This may planarize the surface, or at least nearly planarize to leave small gaps between the mesas to allow for better registration of the elements when they are transferred to the transfer surface. The same or a different dielectric will also form a layer such as 11 on the mesas. Again, for simplicity, this layer is not shown in subsequent layers.

Figure 13:
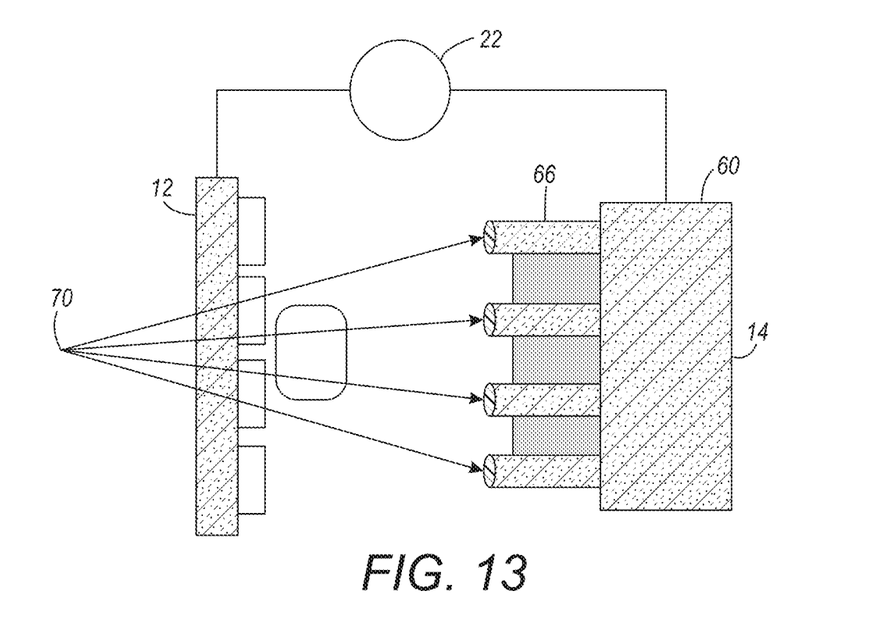
FIGS. 13-15 show an embodiment of a transfer between an assembly surface and an intermediate transfer surface with contact.
Figures 14, 15:
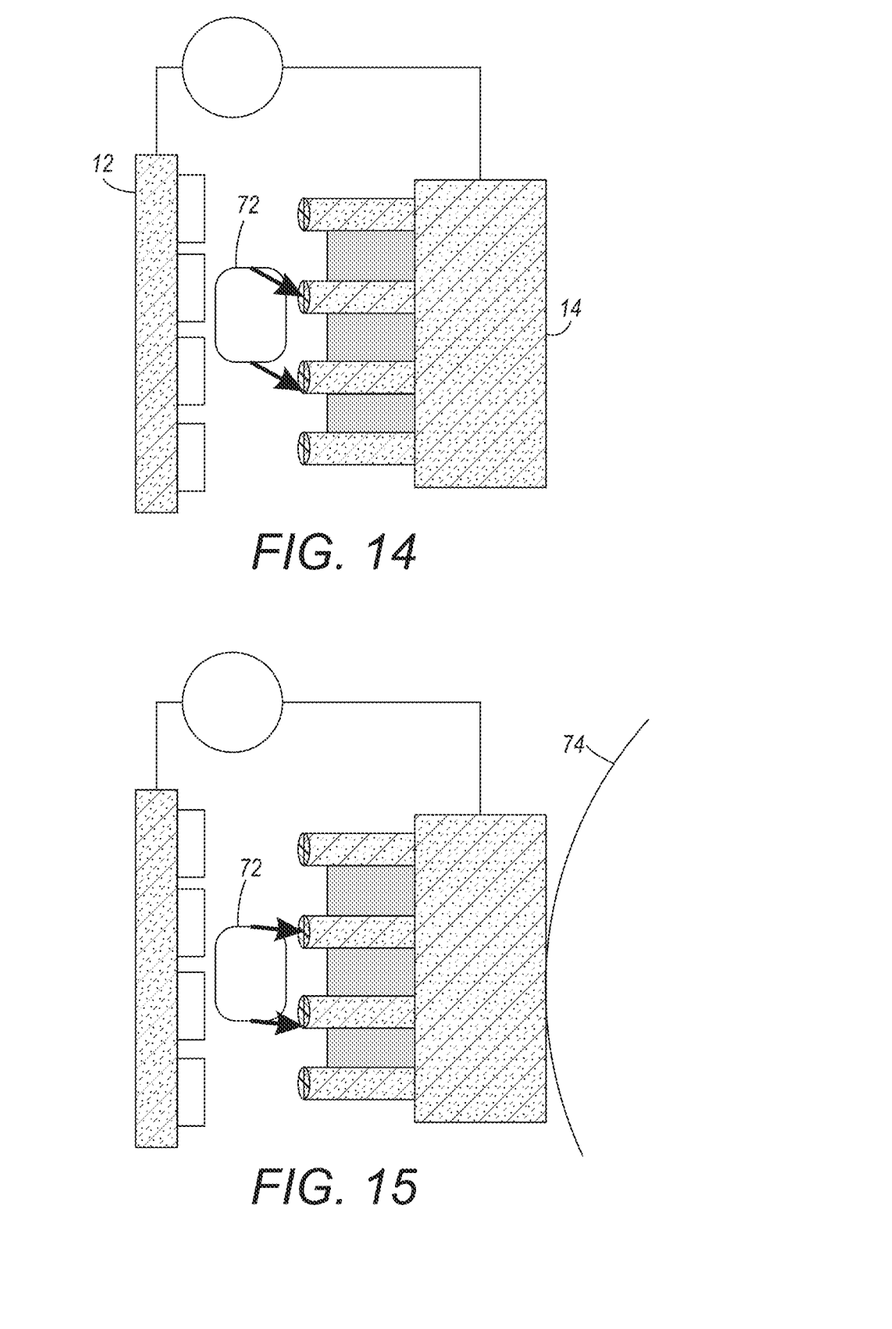

With a transfer surface, however it is manufactured, one can apply a bias between the assembly template and the transfer surface, as shown in FIGS. 13-15. The important aspect of this embodiment is that an array of electrodes 70 will concentrate the electric field on the transfer surface at the edges of the electrodes. In this embodiment, the voltage controller 22 is in contact with both the assembly surface and the transfer surface, rather than two separate controllers. For example, the controller could be a computer connected to a voltage source or sources. In FIG. 13, the assembly surface 12 and the transfer surface 14 are connected to a common controller 22. The transfer surface 14 consists of the conductive surface 60 with mesas such as 66. The application of a bias will create areas 70 of high field gradient around each tip which will create a dielectrophoretic force. This force will attract the edges of the particles to help maintain fidelity during transfer. This will only assist with motion or perturbations in the assembly plane and will not levitate the particle 72 to the transfer plane or hold it against the transfer plane as was discussed in the previous embodiments. In this embodiment, the two planes 14 and 12 will come close enough for the assembled element to come into contact with the assembly plane as shown in FIG. 14, relying on van der Walls forces to hold the particle on the transfer surface. The DEP force will ensure the particles end up with the correct placement during the physical transfer. As shown in FIG. 15, the physical features will serve to create an electrostatic design grid on the transfer plane that will hold the fidelity of the assembly as it is transferred. This approach has the benefit of simplicity. Only a single electrical connection is needed on the transfer surface. One consideration lies with surface energies chosen in order to ensure particles will transfer from the assembly template to the transfer template.

Figure 16:
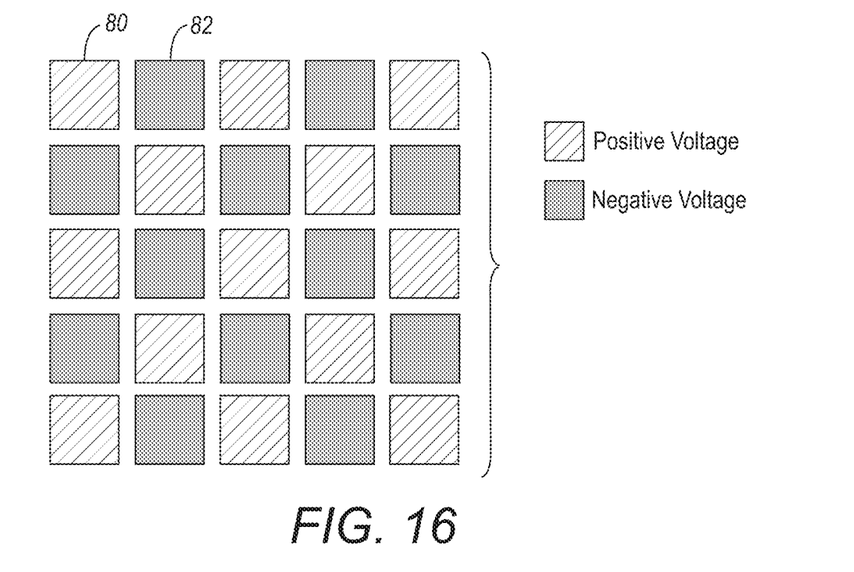
FIGS. 16-18 show embodiments of control electrode architectures for an intermediate transfer surface.

Alternatively, the surface could be created by micropatterning electrodes that have at least as fine a pitch as the assembly template electrodes. The electrode array could be patterned on a planar surface that is rigid or flexible and then mounted on a roll 74. The circuitry that drives the electrodes could take one of many forms depending upon the requirements of the system design, each with varying degrees of complexity. FIG. 16 shows one example of one such circuit and its signal inputs. The polarity of the electrodes are fixed and simple circuitry will allow control over the amplitude of the electric field. The electrodes 80 and 82 have opposite polarity. The polarity of the electrodes are fixed and simple circuitry will allow control over the amplitude of the electric field. The transfer process may be controlled by the same computer system which drives the assembly template and has the ability to control the amplitude of the voltage on all electrodes on the transfer template, and as a result, the reach of the potential wells.

Figure 17:
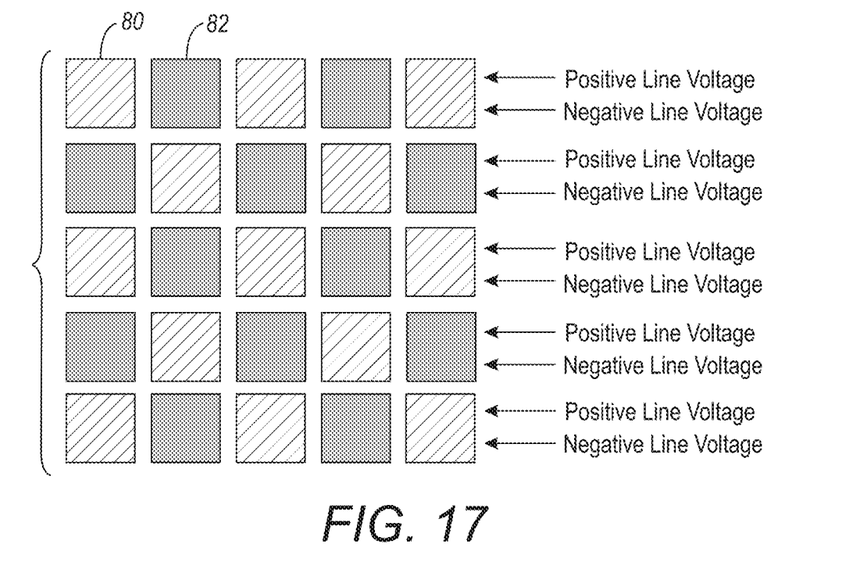

In an alternative embodiment, the circuitry driving the electrode array would have the ability to control the amplitude of the voltage on each line in the cross-process direction of the transfer surface, shown in FIG. 17. The electrodes 80 and 82 still have opposite polarity, but the driving signals are on the line level, instead of on the array level. The controller will then sequentially transfer the assembly in a line by line fashion giving the system another control with which to help ensure fidelity, at the expense of complexity of the drive circuit and back plane that makes up the multipass transfer surface.

Figure 18:
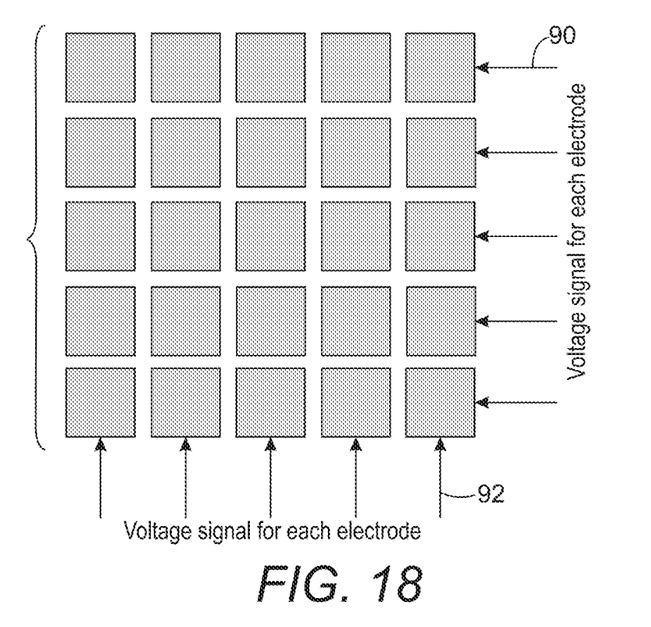

Another alternative design is shown in FIG. 18. The circuitry driving the micropatterned electrode array used to generate potential wells would have the ability to control the amplitude of the voltage on each individual electrode, addressed by driving lines such as 90 and 92. In this embodiment, the control computer can use the transfer surface to do sophisticated, particle-by-particle transfer that could help maintain fidelity as well. While providing the most degrees of freedom, this approach also requires the most complex circuit design and deterministic control for the transfer surface.

In this manner, one can vary the design of the surface electrodes to match the desired complexity and control. The resulting microassembly system allows for successful transfer of assembled elements from an assembly surface to a final substrate, maintaining alignment and orientation without disruption. This allows for the possibility of building up multiple layers of the same type of particle in very close proximity that may not be possible in a single assembly process due to path planning and neighboring particle field limitations. It also allows for the possibility of creating heterogeneous assemblies by sequentially aligning multiple assemblies on a single surface. Once all assemblies are in place and aligned to each other on the transfer surface it is possible to use optical or thermal curing to fuse the assembly together to provide some mechanical support to maintain fidelity when the multiple assembly is transferred to the final substrate via mechanical means.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. An intermediate transfer surface, comprising:
   a substrate;
   a two-dimensional array of electrodes on the substrate;
   a dielectric spacer layer on the two-dimensional array of electrodes; and
   a voltage controller electrically connected to the array of electrodes, wherein the intermediate transfer surface is positioned to receive an assembly having a registration from an assembly surface and the voltage controller is to generate an electrostatic field to attract the assembly from the assembly surface without mechanical transfer such that the registration is maintained;
   wherein the dielectric spacer layer forms a final substrate for the assembly transferred to the intermediate transfer surface.

2. The intermediate transfer surface of claim 1, wherein the array of electrodes comprise protruding exposed regions of a conductive textured substrate, the protruding regions adjacent to recessed regions filled with a dielectric.

3. The intermediate transfer surface of claim 1 wherein the array of electrodes are mesas formed of the substrate separated by gaps filled with dielectric.

4. The intermediate transfer surface of claim 1, wherein the two-dimensional array of electrodes have a pitch finer than a pitch of an assembly surface.

5. The intermediate transfer surface of claim 1, wherein the two-dimensional array of electrodes are connected to the voltage controller such that the voltage controller can apply different potentials to either individual electrodes or groups of electrodes.

6. The intermediate transfer surface of claim 1, wherein the substrate comprises a flexible material.

7. The intermediate transfer surface of claim 1, wherein the substrate is mounted on a flexible roll.

8. The intermediate transfer surface of claim 1, wherein the voltage controller comprises an adjustable voltage controller.

9. The intermediate transfer surface of claim 1, wherein a local optical curing system is paired with the transfer surface to direct electromagnetic energy at gaps between potential wells of the intermediate transfer surface.

10. A microassembly system, comprising:
    an assembly surface having a first two dimensional array of electrodes on a first surface;
    a first voltage source electrically connected to the first array of electrodes to form potential wells;
    an intermediate transfer surface having a second two dimensional array of electrodes on a second surface arranged to face the first surface and positioned to receive an assembly from the assembly surface; and
    a second voltage source electrically connected to the second array of electrodes to form potential wells, such that the second voltage source is to generate an electrostatic field to attract the assembly from the assembly surface without mechanical transfer.

11. The microassembly system of claim 10, wherein the second voltage source is electrically connected to the second array of electrodes in a checkerboard pattern to allow uniform control of potential wells across the array.

12. The microassembly system of claim 10, wherein the second voltage source is electrically connected to the second array of electrodes to allow potential wells in each line of the array to be controlled together.

13. The microassembly system of claim 10, wherein the second voltage source is electrically connected to the second array of electrodes to allow individual control of potential wells across the array.

14. The microassembly system of claim 10, wherein the first voltage source and the second voltages source are controllable to have the first voltage source generate a voltage to repulse the assembly at the same time that the second voltage source generates a voltage to attract the assembly.

15. An intermediate transfer surface, comprising:
    a substrate;
    a two-dimensional array of electrodes on the substrate;
    a dielectric spacer layer on the two-dimensional array of electrodes;
    a local curing system that is paired with the transfer surface to direct electromagnetic energy at gaps between potential wells of the intermediate transfer surface; and a voltage controller electrically connected to the array of electrodes, wherein the intermediate transfer surface is positioned to receive an assembly having a registration from an assembly surface and the voltage controller is to generate an electrostatic field to attract the assembly from the assembly surface without mechanical transfer such that the registration is maintained.

\* \* \* \* \*